(12) United States Patent
Yamashita

(10) Patent No.: US 7,345,288 B2
(45) Date of Patent: Mar. 18, 2008

(54) SAMPLE HOLDER AND ION-BEAM PROCESSING SYSTEM

(75) Inventor: Takushi Yamashita, Tokyo (JP)

(73) Assignee: Jeol Ltd., Tokyo (JP)

( * ) Notice: Subject to any disclaimer, the term of this patent is extended or adjusted under 35 U.S.C. 154(b) by 261 days.

(21) Appl. No.: 11/328,721

(22) Filed: Jan. 10, 2006

(65) Prior Publication Data

US 2006/0169923 A1    Aug. 3, 2006

(30) Foreign Application Priority Data

Jan. 20, 2005    (JP)    ............................. 2005-012253

(51) Int. Cl.
*H01J 37/20*    (2006.01)
(52) U.S. Cl. .............................. 250/440.11; 156/345.3; 156/345.39
(58) Field of Classification Search ........... 250/440.11; 156/345.3, 345
See application file for complete search history.

(56) References Cited

U.S. PATENT DOCUMENTS 4,550,258 A * 10/1985 Omata et al. ............ 250/505.1
5,907,157 A * 5/1999 Yoshioka et al. ........ 250/492.2
6,914,244 B2 * 7/2005 Alani ........................ 250/307
2005/0081997 A1 * 4/2005 Yoshioka et al. ........ 156/345.3

FOREIGN PATENT DOCUMENTS

JP    2003-173754    6/2003

* cited by examiner

*Primary Examiner*—Jack I. Berman
(74) *Attorney, Agent, or Firm*—The Webb Law Firm

(57) ABSTRACT

A sample holder and ion-beam processing system are offered which permit a good sample adapted for observation (such as TEM (transmission electron microscopy) observation). The sample holder has a sample placement portion having a sample adhering surface. The holder further includes a shielding material guide portion placed over the sample placement portion. The guide portion is fixedly mounted to the sample placement portion and has a shielding material guide surface. The sample adhering surface is in a position lower than the position of the shielding material guide surface by a given amount of 40 μm. Therefore, when the sample having a thickness of 100 μm is attached to the sample adhering surface, the sample protrudes 60 μm ahead of the shielding material guide surface. The shielding material having a thickness of about 20 μm is then placed in position over the shielding material guide surface.

5 Claims, 4 Drawing Sheets

SAMPLE HOLDER AND ION-BEAM PROCESSING SYSTEM

BACKGROUND OF THE INVENTION

1. Field of the Invention

The present invention relates to an ion-beam processing system for preparing a sample observed with a transmission electron microscope or other instrument and also to a sample holder used in the ion-beam processing system.

2. Description of Related Art

Ion-beam processing equipment described in Japanese Patent Laid-Open No. 2003-173754 is known for preparing a thin film sample observed with a transmission electron microscope (TEM). This equipment, shown in FIG. 1 of the patent reference, has a shielding material disposed over a sample. An ion beam is directed at both the shielding material and the sample from above the shielding material. The sample portion that is not shielded by the shielding material is ion-etched. In this equipment, a sample holder (13) on which a sample is set is spaced from a shielding material support device (23) holding the shielding material. The position of the shielding material is so adjusted that the shielding material is located in the center of the sample.

In the conventional system, the sample holder (13) is not formed integrally with the shielding material support device (23) as described previously but they are disposed in a spaced relationship to each other. Therefore, if external vibrations, for example, are transmitted to the system during processing of the sample, the shielding material and sample will be vibrated with different amplitudes in different directions. This will vary the positional relationship between the shielding material and the sample. Where the position of the shielding material relative to the sample is varied by an external perturbation during processing of the sample in this way, a good sample adapted for TEM observation cannot be prepared.

Furthermore, in the conventional system, the position of the shielding material must be adjusted to place it in the center of the sample as described previously. Normally, this operation is performed by the operator. That is, the operator makes the adjustment while watching through an optical microscope. Such an adjustment must be made whenever a sample is processed, which is greatly annoying to the operator.

SUMMARY OF THE INVENTION

It is an object of the present invention to provide a good sample holder and ion-beam processing system permitting a sample adapted for observation to be prepared easily.

A sample holder that achieves the above-described object has a sample placement portion on which a sample is placed in position and a shielding-material guide portion disposed over the sample placement portion. The sample placement portion defines the position of the sample. The shielding material guide portion guides a shielding material to place it in position over the sample.

Therefore, according to the present invention, the sample holder and the ion-beam processing system permit a good sample adapted for observation to be prepared easily.

Other objects and features of the invention will appear in the course of the description thereof, which follows.

DESCRIPTION OF THE PREFERRED EMBODIMENTS

The preferred embodiments of the present invention are hereinafter described with reference to the accompanying drawings.

Figure 1A:
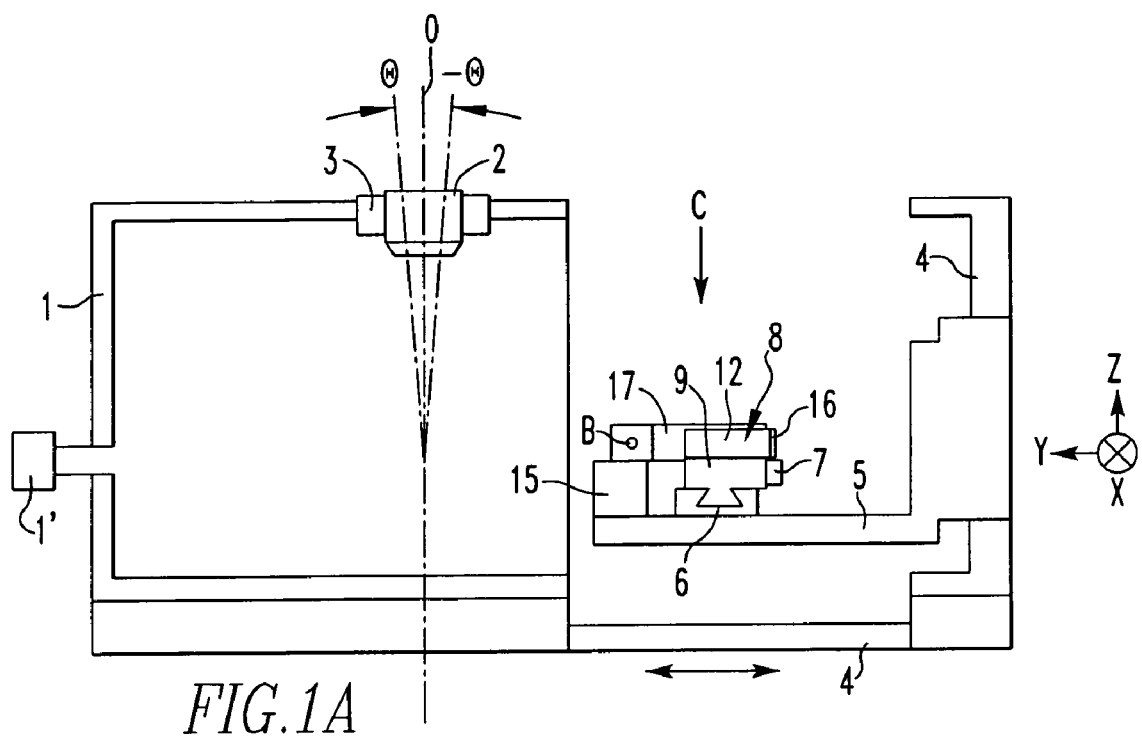
FIGS. 1A and 1B are vertical cross sections of an ion-beam processing system according to one embodiment of the present invention in pullout and closed positions, respectively.
Figure 1B:
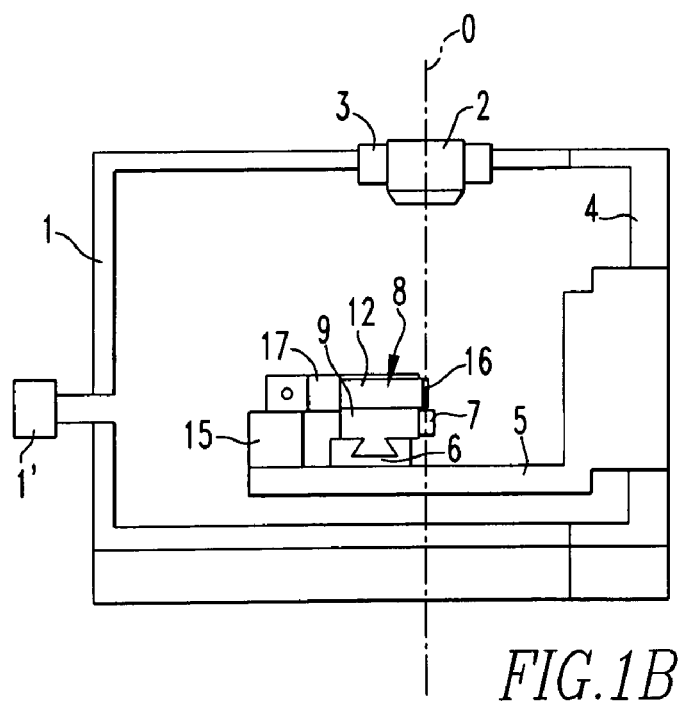

Referring to FIGS. 1A and 1B, there is shown an ion-beam processing system according to one embodiment of the present invention. The structural configuration of the system shown in FIGS. 1A and 1B are first described. The system has a vacuum chamber 1 that is designed to be evacuable by a pumping system 1'. An ion gun 2 is disposed on top of the chamber 1. The ion gun 2 is supported on a gun-tilting mechanism 3, which, in turn, can tilt the ion gun 2 left and right (y-direction and -y-direction) through θ° about an optical axis O parallel to the z-axis. A gas ion gun is used as the ion gun 2. For example, the gas ion gun releases Ar ions by ionizing Ar gas in an electric discharge.

A sample stage pullout mechanism 4 is mounted to the vacuum chamber 1 so as to be capable of being opened and closed. In the state shown in FIG. 1A, the pullout mechanism 4 is open. In the state shown in FIG. 1B, the pullout mechanism 4 is closed. A sample stage 5 is mounted to the pullout mechanism 4 so as to be tiltable about the y-axis.

A holder position-adjusting mechanism 6 is disposed on the sample stage 5. A sample holder 8 on which a sample 7 has been placed in position is set in the holder position-adjusting mechanism 6, which is designed to be capable of moving the sample holder 8 in the directions of the x- and y-axes.

FIGS. 2A-2D illustrate the sample holder 8. In the state shown in the perspective view of FIG. 2A, the sample 7 is not set on the sample holder 8. In the state shown in FIG. 2B, the sample holder 8 is viewed from side A (from the -x-direction of FIGS. 2A and 1A). In the state shown in FIG. 2C, the sample 7 is set on the holder 8. In the state shown in FIG. 2D, the sample holder 8 is viewed also from the side A.

Figure 2A:
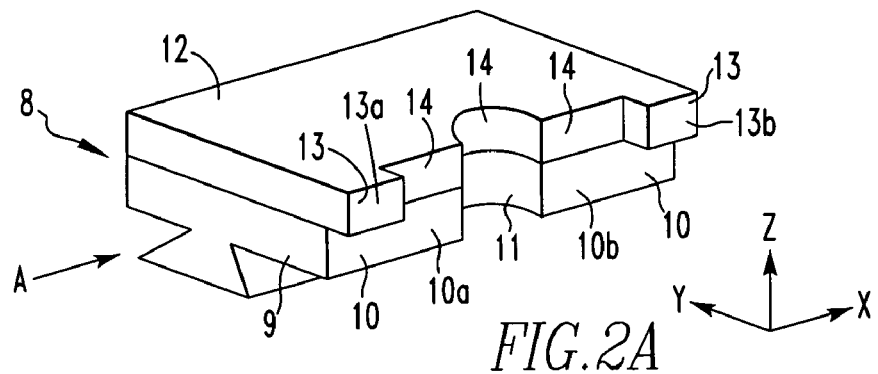
FIG. 2A is a perspective view of a sample holder with no sample in place.

Referring still to FIGS. 2A-2D, a sample placement portion 9 has a sample adhering surface 10 (see FIG. 2A). The adhering surface 10 is provided with a groove 11 permitting an ion beam to pass through. The sample adhering surface 10 is split by the groove 11 into a left adhering surface portion 10a and an adhering surface portion 10b which are on the opposite sides of the groove 11. The left surface portion 10a and right surface portion 10b are on the same plane and parallel to the xz-plane.

Figure 2B:
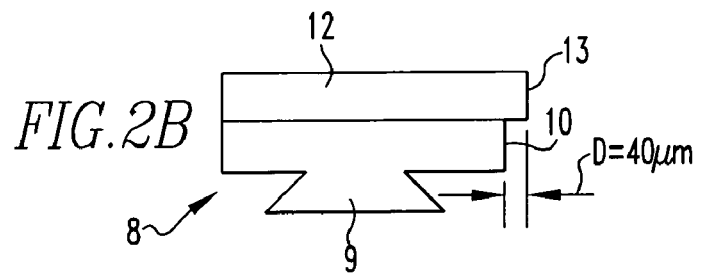
FIG. 2B is a side view of the sample holder in FIG. 2A.
Figure 2C:
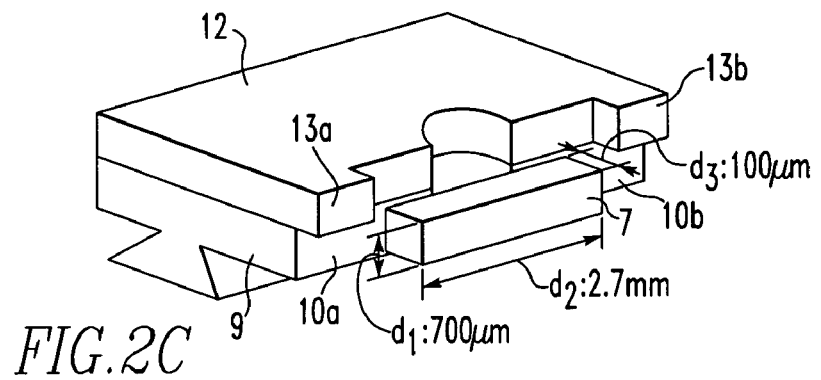
FIG. 2C is a perspective view of a sample holder with a sample in place.

As shown in FIG. 2C, one end of the sample 7 is stuck to the left adhering surface portion 10a with adhesive. The other end of the sample 7 is stuck to the right adhering surface portion 10b with adhesive. In this way, the sample 7 is attached to from the left adhering surface portion 10a to the right adhering surface portion 10b, the surface portions 10a and 10b defining the position of the sample (i.e., the position of the sample 7 in the y-direction in FIG. 2A and FIGS. 1A and 1B). The dimension $d_1$ of the sample 7 in the vertical direction is about 700 µm. The dimension $d_2$ in the lateral direction is about 2.7 mm. The thickness $d_3$ is about 100 µm. The sample 7 has been extracted, for example, from a bulk sample and roughly polished.

Referring still to FIGS. 2A-2D, a shielding material guide portion 12 is placed on and fixed to the sample placement portion 9. That is, the sample holder 8 shown in FIG. 2A is formed by integrating the shielding material guide portion 12 and the sample placement portion 9.

The shielding material guide portion 12 has a shielding material guide surface 13 as seen in FIG. 2A. A groove 14 is formed in the guide surface 13 to permit an ion beam to pass through. The guide surface 13 is divided by the groove 14 into a left guide surface portion 13a and a right guide surface portion 13b which are placed on the same plane parallel to the xz-plane.

Figure 2D:
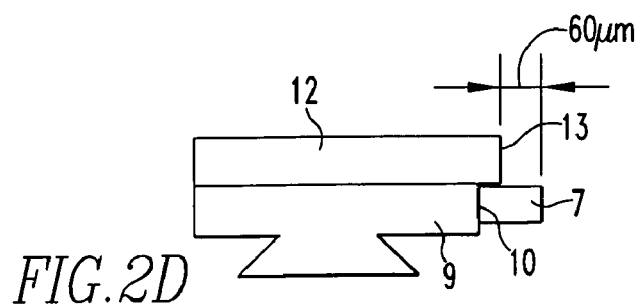
FIG. 2D is a side view of FIG. 2C.

The two shielding material guide surface portions 13a and 13b are parallel to the sample adhering surface portions 10a and 10b. As shown in FIG. 2B, the sample adhering surface 10 is at a position lower than the position of the shielding material guide surface 13 by a given distance D (in this case, D=40 µm). Since the sample adhering surface 10 is downwardly, shifted with respect to the shielding material guide surface 13 by the given distance D=40 µm in this way, if the sample 7 having a thickness of 100 µm is placed on the sample placement surface 10, the sample 7 protrudes 60 µm forwardly relative to the shielding material guide surface 13 as shown in FIG. 2D. The structure of the sample holder 8 has been described so far in connection with FIGS. 2A-2D.

Referring back to FIGS. 1A and 1B, a shielding material position-adjusting mechanism 15 is placed on the sample stage 5 and supports a shielding material-holding mechanism 17 holding the shielding material 16. The shielding material position-adjusting mechanism 15 can move the shielding material-holding mechanism 17 in the directions of the y- and z-axes. The adjusting mechanism 15 can also tilt the holding mechanism 17 around an axis B parallel to the x-axis. The position-adjusting mechanism 15 and shielding material-holding mechanism 17 holding the shielding material 16 together constitute a shielding material-setting mechanism, which is used to place the shielding material 16 in position on the shielding material guide surface portions 13a and 13b (FIG. 2) of the shielding material guide portion 12.

Figure 3A:
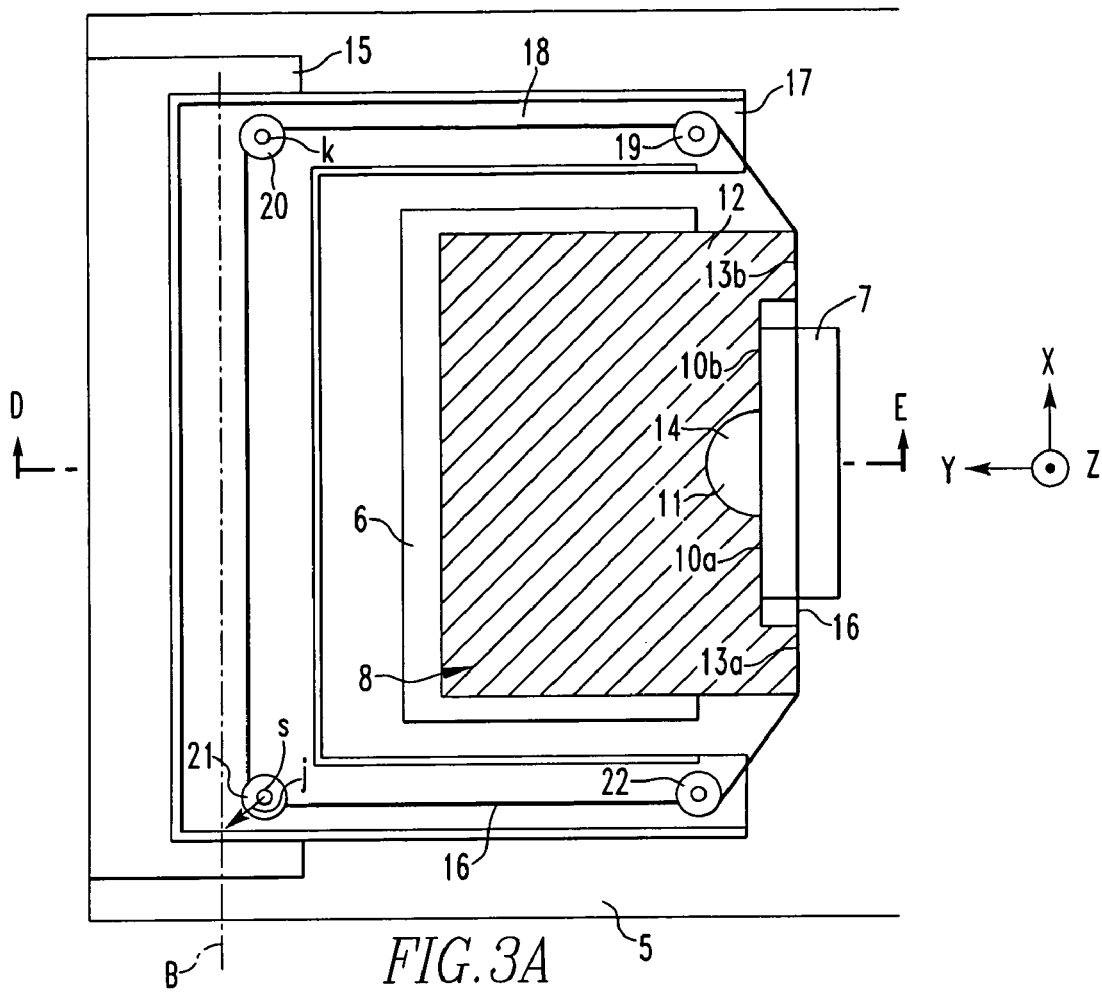
FIGS. 3A and 3B are views illustrating a shielding material-holding mechanism 17 shown in FIGS. 1A and 1B.
Figure 3B:
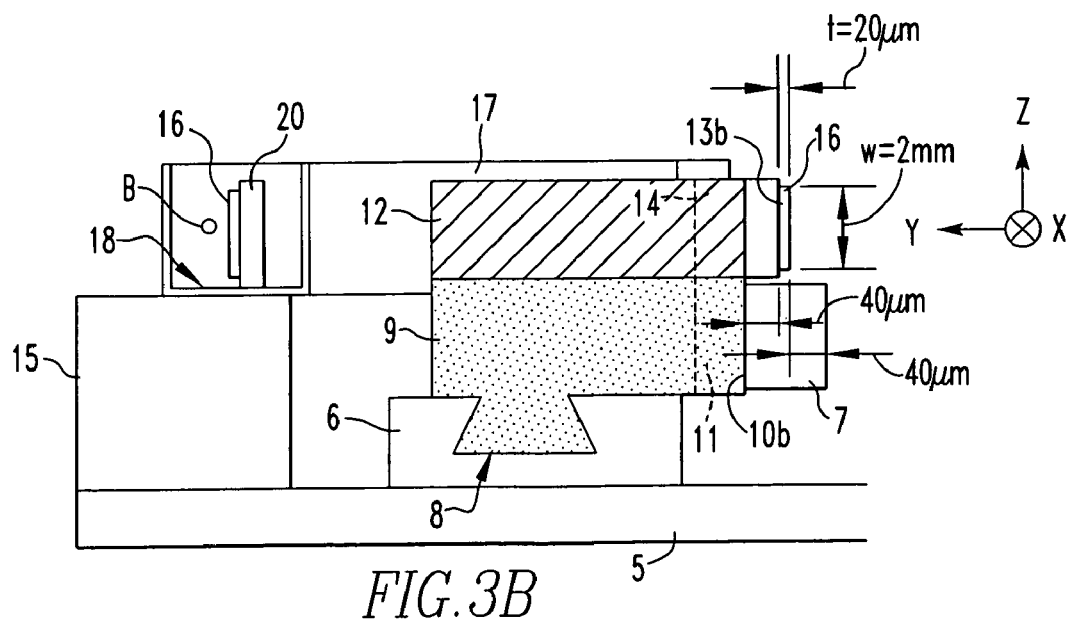

The shielding material-setting mechanism is described by referring to FIGS. 3A and 3B. FIG. 3A is a view as taken from side C of the shielding material-holding mechanism 17 shown in FIG. 1A, i.e., taken from above. FIG. 3B is a cross-sectional view taken on line D-E of FIG. 3A. In the state shown in FIG. 3D, the shielding material 16 is placed in position on the shielding material guide surface portions 13a and 13b of the shielding material guide portion 12.

As shown in FIG. 3A, the shielding material-holding mechanism 17 supported on the shielding material position-adjusting mechanism 15 assumes a U-shaped form. The holding mechanism 17 has an inner bottom surface 18 on which four pulleys 19-22 are disposed. Of these four pulleys, the three pulleys 19, 20, and 22 are fixedly mounted to the inner bottom surface 18, while the remaining pulley 21 is pulled in the direction of the arrow j by a spring S and attached to the shielding material-holding mechanism 17.

A belt-like (ribbon-like or tape-like) ion beam-shielding material 16 is annularly trained around the pulleys 19-22. The shielding material 16 is in contact with the shielding material guide surface portions 13a and 13b of the shielding material guide portion 12 as shown also in FIGS. 3A and 3B and is stretched without slack over the whole circle. The shielding material 16 is made of an amorphous metal such as a nickel-phosphorus alloy containing more than 10% phosphorus. As shown in FIG. 3B, the thickness t of the shielding material 16 is about 20 µm and the width w is about 2 mm.

The pulley 20 is rotated about an axis k parallel to the z-axis by rotation of a motor (not shown) built in the shielding material-holding mechanism 17. When the pulley 20 turns in this way, the shielding material 16 trained around the pulley 20 is automatically fed.

Figure 4:
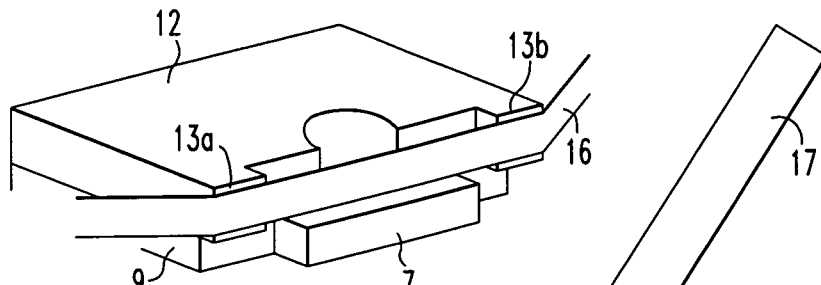
FIG. 4 is a perspective view of a shielding material 16 set in a shielding material guide portion 12.

FIG. 4 is a perspective view of the shielding material shown in FIG. 3A. In the state shown in FIG. 4, the shielding material 16 is placed in position on the shielding material guide surface portions 13a and 13b of the shielding material guide portion 12. The structure of the ion-beam processing system of FIG. 1 has been described so far in connection with FIGS. 2A-2B, FIGS. 3A-3B, and 4.

Figure 5A:
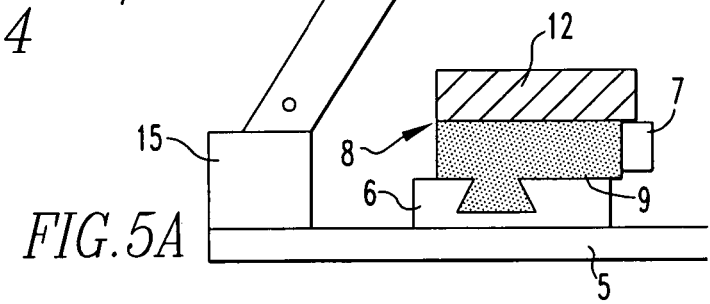
FIGS. 5A and 5B are views illustrating the manner in which the shielding material 16 is set in the shielding material guide portion 12.
Figure 5B:
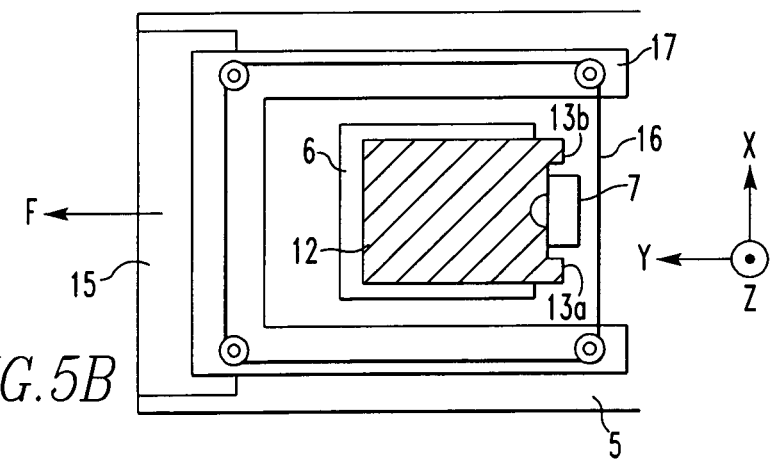

The manner in which the sample holder 8 is placed in position in the holder position-adjusting mechanism 6 and the manner in which the shielding material 16 is placed in position relative to the shielding material guide portion 12 are next described by referring to FIGS. 5A and 5B.

First, the sample holder 8 is placed in position in the holder position-adjusting mechanism 6 while the sample stage pullout mechanism 4 is opened as shown in FIG. 1A. As shown in FIG. 5A, the shielding material-holding mechanism 17 is tilted by the shielding material position-adjusting mechanism 15 and retracted to assure that the sample holder 8 is placed in position unobstructively. Then, as shown in FIG. 5A, the sample holder 8 on which the sample 7 has been placed in position is placed in position on the holder position-adjusting mechanism 6 by the operator.

After the sample holder 8 is placed in position in the holder position-adjusting mechanism 6 in this way, the tilted shielding material-holding mechanism 17 is returned to the original horizontal posture by the shielding material position-adjusting mechanism 15. When the shielding material-holding mechanism 17 is returned to the horizontal posture in this manner, the position of the shielding material-holding mechanism 17 in the y-direction is adjusted by the shielding material position-adjusting mechanism 15 to prevent the shielding material 16 from touching the shielding material guide surface portions 13a and 13b as shown FIG. 5B. Then, the shielding material-holding mechanism 17 is moved a given distance in the y-direction indicated by the arrow F in FIG. 5B by the position-adjusting mechanism 15 to bring the shielding material 16 into contact with the shielding material guide surface portions 13a and 13b. Because of this movement, the shielding material 16 touches the shielding material guide surface portions 13a and 13b as shown in FIG. 3A. The shielding material 16 is stretched between the guide surface portions 13a and 13b and placed in position in the shielding material guide portion 12. That is, the shielding material 16 is guided to the guide surface portions 13a and 13b. The position of the shielding material 16 on the sample 7 taken in the y-direction is defined by the guide surface portions 13a and 13b.

The procedure in which the shielding material 16 is placed in position relative to the shielding material guide portion 12 has been described so far. The sample holder 8 according to the present invention is so designed that the shielding material guide surface portions 13a and 13b protrude a given distance of 40 μm from the sample adhering surface portions 10a and 10b. A shielding material having a thickness of 20 μm is selected as the shielding material 16. A sample having a thickness of 100 μm is prepared as the sample 7. Therefore, the shielding material 16 is placed in the center of the sample 7 in an erected posture as shown in FIG. 3 simply by placing the sample 7 in position on the sample adhering surface portions 10a and 10b of the sample placement portion and placing the shielding material 16 in position relative to the shielding material guide surface portions 13a and 13b of the shielding material guide portion. The z-coordinate of the shielding material-holding mechanism 17 is adjusted by the shielding material position-adjusting mechanism 15 such that the gap between the shielding material 16 and the sample 7 is set to about 10 to 30 μm.

Figure 6:
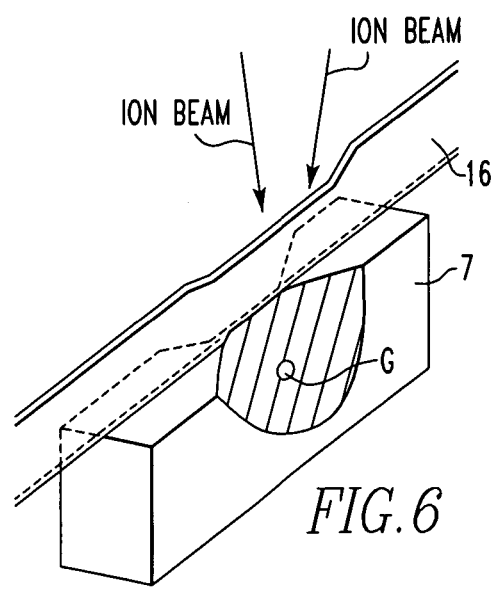
FIG. 6 is a schematic perspective view illustrating a sample prepared by ion-beam processing.

On the other hand, when the sample holder 8 is detached from the holder position-adjusting mechanism 6, the shielding material 16 is moved away from the shielding material guide portion 12 as shown in FIG. 5B. Then, as shown in FIG. 5A, the shielding material-holding mechanism 17 is tilted. Thereafter, the sample holder 8 is detached from the holder position-adjusting mechanism 6. By tilting the shielding material 16 after moving it away from the shielding material guide portion 12 in this way, the shielding material 16 can be protected against friction with the shielding material guide portion 12.

Where the sample 7 is processed with an ion beam, the sample stage pullout mechanism 4 is closed as shown in FIG. 1B. At this time, the position of the sample holder 8 in the y-direction has been previously adjusted by the holder position-adjusting mechanism 6 to bring the shielding material 16 onto the optical axis O of the ion gun 2. The ion beam is released from the ion gun 2, and the sample 7 is etched by the portion of the ion beam which is not obstructed by the shielding material 16. During this etching of the sample, the ion gun 2 is repetitively tilted left and right about the optical axis O (y-direction and -y-direction) by the gun tilting mechanism 3. Consequently, the ion beam enters the sample 7 from obliquely leftwardly above the shielding material 16 and from obliquely rightwardly above the shielding material 16 repetitively. As a result, a TEM sample 7 having a hole G as shown in FIG. 6 is finished. The portion around the hole G is a thin film adapted for TEM observation. In TEM, a good observation of the sample can be made by directing an electron beam at this thin film portion.

The sample holder and ion-beam processing system according to the present invention have been described so far in connection with the drawings. As described previously, the sample holder 8 according to the present invention has a sample placement portion 9 for defining the position of a sample and a shielding material guide portion 12 for defining the position of a shielding material 16 to place the shielding material in position over the sample. The sample placement portion and the shielding material guide portion are made integral. Therefore, the shielding material can be placed in position over the sample simply by placing the sample in position on the sample placement portion and placing the shielding material in position relative to the shielding material guide portion. Consequently, the conventional adjustment of the position of the shielding material is dispensed with. The positional relationship between the shielding material and the sample can be maintained constant at all times. This positional relationship is not affected by external perturbations, such as vibrations. That is, if vibrations are produced, the shielding material and sample move as a unit and so a good sample adapted for TEM observation can be prepared by using the sample holder according to the present invention.

It is to be understood that the sample holder and ion-beam processing system according to the present invention can also be used for fabrication of samples observed with a scanning electron microscope, electron probe microanalyzer, Auger microprobe, and other instrument.

In the above-described embodiment, the shielding material guide portion 12 and the sample placement portion 9 are prepared separately. The guide portion 12 is fixedly mounted to the sample placement portion 9, thus preparing the sample holder 8. The sample holder 8 having the shape shown in FIG. 2A may be prepared in one operation by processing one material instead of preparing the shielding material guide portion 12 and sample placement portion 9 separately as described above.

Having thus described my invention with the detail and particularity required by the Patent Laws, what is desired protected by Letters Patent is set forth in the following claims.

The invention claimed is:

1. A sample holder for use in an ion-beam processing system for placing a shielding material over a sample to block a part of an ion beam emitted from an ion gun by the shielding material and for processing the sample by a portion of the ion beam that is not blocked by the shielding material, said sample holder comprising:
   a sample placement portion on which the sample is placed in position, the sample placement portion defining the position of the sample; and
   a shielding-material guide portion disposed over the sample placement portion and acting to guide the shielding material such that the shielding material is placed in position over the sample and to define the position of the shielding material.

2. A sample holder as set forth in claim 1, wherein:
   (A) said sample placement portion has a sample adhering surface on which the sample is stuck,
   (B) said shielding material guide portion has a shielding material guide surface substantially parallel to said sample adhering surface, and
   (C) said sample adhering surface is formed in a position lower than the position of said shielding material guide surface by a given amount.

3. A sample holder as set forth in claim 2, wherein said shielding material guide surface and said sample adhering surface are provided with grooves to permit the ion beam from the ion gun to pass through.

4. An ion-beam processing system for placing a shielding material over a sample to block a part of an ion beam emitted from an ion gun by the shielding material and for processing the sample by a portion of the ion beam that is not blocked by the shielding material, said ion-beam processing system comprising:
   a sample holder having (a) a sample placement portion on which the sample is placed in position and (b) a shielding material guide portion located over the sample placement portion, the sample placement portion acting to define the position of the sample, the shielding material guide portion acting to guide the shielding material and to define the position of the shielding material so as to place the shielding material in position over the sample; and a shielding material-setting mechanism for holding the shielding material and placing it in position in said shielding material guide portion.

5. An ion-beam processing system as set forth in claim 4, wherein said shielding material is shaped like a belt, ribbon, or tape, and wherein said shielding material is placed to be substantially erected over the sample.

* * * * *